US012197742B2

(12) United States Patent
Kaynak et al.

(10) Patent No.: US 12,197,742 B2
(45) Date of Patent: Jan. 14, 2025

(54) MANAGING ERROR COMPENSATION USING CHARGE COUPLING AND LATERAL MIGRATION SENSITIVITY

(71) Applicant: Micron Technology, Inc., Boise, ID (US)

(72) Inventors: Mustafa N. Kaynak, San Diego, CA (US); Patrick R. Khayat, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 17/860,701

(22) Filed: Jul. 8, 2022

(65) Prior Publication Data

US 2023/0393755 A1    Dec. 7, 2023

Related U.S. Application Data

(60) Provisional application No. 63/348,301, filed on Jun. 2, 2022.

(51) Int. Cl.
| | |
|---|---|
| *G06F 3/06* | (2006.01) |
| *G11C 16/10* | (2006.01) |
| *G11C 16/26* | (2006.01) |
| *G11C 16/34* | (2006.01) |
| *G11C 16/04* | (2006.01) |

(52) U.S. Cl.
CPC .......... *G06F 3/0619* (2013.01); *G06F 3/0655* (2013.01); *G06F 3/0679* (2013.01); *G11C 16/10* (2013.01); *G11C 16/26* (2013.01); *G11C 16/34* (2013.01); *G11C 16/0483* (2013.01)

(58) Field of Classification Search
CPC ................................................. G11C 16/3459
See application file for complete search history.

(56) References Cited

U.S. PATENT DOCUMENTS

| | | | | |
|---|---|---|---|---|
| 11,545,229 | B1* | 1/2023 | Sharifi Tehrani | G11C 29/42 |
| 2008/0198650 | A1* | 8/2008 | Shalvi | G06F 11/1068 |
| | | | | 365/45 |
| 2011/0066902 | A1* | 3/2011 | Sharon | G11C 29/52 |
| | | | | 714/E11.034 |
| 2011/0216598 | A1* | 9/2011 | Kim | G11C 16/26 |
| | | | | 365/189.05 |
| 2016/0011970 | A1* | 1/2016 | Sakurada | G06F 12/0246 |
| | | | | 711/103 |

* cited by examiner

*Primary Examiner* — Douglas King
(74) *Attorney, Agent, or Firm* — Lowenstein Sandler LLP

(57) ABSTRACT

Embodiments disclosed can include determining, for each memory cell connected to each wordline, a respective value of a metric that reflects a sensitivity of a threshold voltage associated with the memory cell to a change in a threshold voltage of an adjacent cell and determining, for each wordline, based on the determined sensitivity for each memory cell, a respective aggregate measure of adjacent cell dependence. They can further include comparing the determined aggregate measure of adjacent cell dependence to a threshold dependence value. They can also include identifying a first wordline group having wordlines with high adjacent cell dependence and a second wordline group having wordlines with low adjacent cell dependence and storing a record referencing the wordlines of the second wordline group, the record indicating a corresponding location on the die of the memory device.

20 Claims, 7 Drawing Sheets

300

DETERMINING, FOR EACH MEMORY CELL CONNECTED TO EACH WORDLINE, A RESPECTIVE VALUE OF A METRIC THAT REFLECTS A SENSITIVITY OF A THRESHOLD VOLTAGE ASSOCIATED WITH THE MEMORY CELL TO A CHANGE IN A THRESHOLD VOLTAGE OF AN ADJACENT CELL 302

DETERMINING, FOR EACH WORDLINE, BASED ON THE DETERMINED SENSITIVITY FOR EACH MEMORY CELL, A RESPECTIVE AGGREGATE MEASURE OF ADJACENT CELL DEPENDENCE 304

COMPARING, FOR EACH WORDLINE, THE DETERMINED AGGREGATE MEASURE OF ADJACENT CELL DEPENDENCE TO A THRESHOLD DEPENDENCE VALUE 306

IDENTIFYING A FIRST WORDLINE GROUP INCLUDING WORDLINES HAVING A MEASURE OF ADJACENT CELL DEPENDENCE THAT IS HIGHER THAN THE THRESHOLD VALUE 308

IDENTIFYING A SECOND WORDLINE GROUP INCLUDING WORDLINES HAVING A MEASURE OF ADJACENT CELL DEPENDENCE THAT IS LOWER THAN THE VALUE 310

STORING, ON THE MEMORY DEVICE, A RECORD LISTING THE WORDLINES OF THE SECOND WORDLINE GROUP, THE RECORD INDICATING, FOR EACH WORDLINE IN THE SECOND WORDLINE GROUP, A LOCATION ON THE DIE OF THE MEMORY DEVICE 312

CALCULATING, FOR A WORDLINE ON A DIE OF A MEMORY DEVICE, AN AGGREGATE MEASURE OF SENSITIVITY OF MEMORY CELLS CONNECTED TO THE WORDLINE TO A CHANGE IN A THRESHOLD VOLTAGE OF AN ADJACENT CELL 502

DETERMINING WHETHER THE CALCULATED MEASURE OF SENSITIVITY SATISFIES A CRITERION RELATIVE TO A THRESHOLD SENSITIVITY VALUE 504

ERROR DURING A MEMORY ACCESS OPERATION WITH RESPECT TO A MEMORY CELL? 506

YES

ADJUSTING ONE OR MORE VOLTAGES APPLIED TO THE MEMORY CELL BASED ON THE DETERMINATION OF WHETHER THE CALCULATED MEASURE OF SENSITIVITY SATISFIES THE CRITERION 508

FIG. 5

MANAGING ERROR COMPENSATION USING CHARGE COUPLING AND LATERAL MIGRATION SENSITIVITY

RELATED APPLICATIONS

This application claims the benefit of U.S. Provisional Patent Application No. 63/348,301, filed Jun. 2, 2022, entitled "Managing Error Compensation Using Charge Coupling and Lateral Migration Sensitivity" which is incorporated by reference herein.

TECHNICAL FIELD

Embodiments of the disclosure relate generally to memory sub-systems, and more specifically, relate to managing error handling and compensation based on sensitivity to charge coupling and lateral migration effects in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a flow diagram of an example method for wordline grouping for error compensation in accordance with some embodiments of the present disclosure;

FIG. 5 is a flow diagram of an example method for error compensation based on wordline grouping in accordance with some embodiments of the present disclosure.

DETAILED DESCRIPTION

Figure 1:
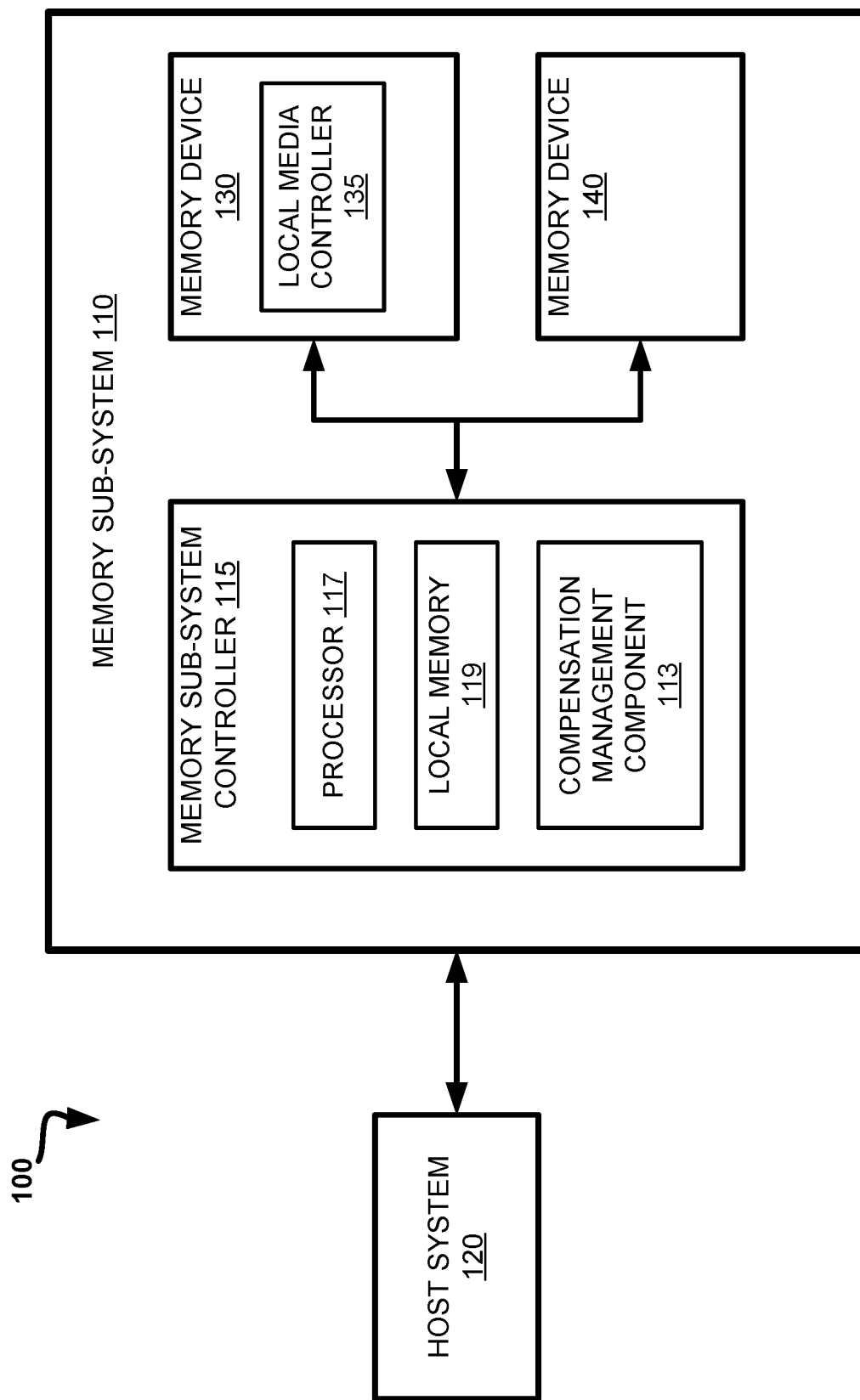
FIG. 1 illustrates an example computing system that includes a memory sub-system in accordance with some embodiments of the present disclosure.

Aspects of the present disclosure are directed to managing error handling and compensation based on sensitivity to charge coupling and lateral migration effects in memory devices. A memory sub-system can be a storage device, a memory module, or a combination of a storage device and memory module. Examples of storage devices and memory modules are described below in conjunction with FIGS. 1-2A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1-2A. A non-volatile memory device is a package of one or more dies. Each die can consist of one or more planes. For some types of non-volatile memory devices (e.g., NAND devices), each plane includes a set of physical blocks. Each block includes a set of pages. Each page includes a set of memory cells ("cells"). A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device includes multiple memory cells arranged in a two-dimensional or three-dimensional grid. Memory cells are formed on (e.g., etched onto) a silicon wafer in an array of columns connected by conductive lines (also hereinafter referred to as bitlines) and rows connected by conductive lines (also hereinafter referred to as wordlines). A wordline can refer to a conductive line that connects control gates of a set (e.g., one or more rows) of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. In another example, the memory device can include multiple access line driver circuits and power circuits that can be shared by the planes of the memory device. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG} < V_t$. The current increases substantially once the control gate voltage has exceeded the threshold voltage, $V_{CG} > V_t$. Because the actual geometry of the electrodes and gates varies from cell to cell, the threshold voltages can be different even for cells implemented on the same die. The cells can, therefore, be characterized by a distribution P of the threshold voltages, $P(Q, V_t) = dW/dV_t$, where dW represents the probability that any given cell has its threshold voltage within the interval $[V_T, V_T + dV_t]$ when charge Q is placed on the cell.

A programming operation can include the application of a series of incrementally increasing programming pulses that to a control gate of a memory cell being programmed. A program verify operation after each programming pulse determines the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A typical program verify operation includes referring to a target threshold voltage and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare whether the present threshold voltage is greater than or equal to the stored target threshold voltage. If the present threshold voltage is greater than or equal to the target threshold voltage, further programming is inhibited. Otherwise, Programming typically continues in this manner with the application of additional program pulses to the memory cell until the target PV of a corresponding $V_t$ and data state is achieved.

Accordingly, certain non-volatile memory devices can use a demarcation voltage (i.e., a read reference voltage) to read data stored at memory cells. For example, a read reference voltage can be applied to the memory cells, and if a threshold voltage of a specified memory cell is identified as being below the read reference voltage that is applied to the specified memory cell, then the data stored at the specified memory cell can be read as a particular value (e.g., a logical '1') or determined to be in a particular state (e.g., a set state). If the threshold voltage of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or comprise a normal distribution of threshold voltages.

A memory device can exhibit threshold voltage distributions $P(Q_k, V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N-1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device in order to distinguish between the multiple logical programming levels and determine the programming state of the cell.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01," "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use 2" levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in an SLC cell, there is 1 read window that exists with respect to the 2 $V_t$ distributions. Analogously, in an MLC cell, there are 3 read windows that exist with respect to the 4 $V_t$ distributions. Similarly, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

Cells of a memory array that are to be read during a read operation can be referred to specified cells (i.e., target cells) connected to a target wordline. The specified cells can neighbor adjacent cells connected to at least one wordline neighboring the specified wordline ("adjacent wordline" i.e., the wordline to which the specified cell is connected). For example, the at least one adjacent wordline can be a single wordline neighboring the specified wordline or a pair of wordlines neighboring the target wordline. Illustratively, the specified wordline can be referred to as an n-th wordline ($WL_n$), and the at least one adjacent wordline can include at least one of adjacent wordline n−1 ($WL_{n-1}$) or adjacent wordline n+1 ($WL_{n+1}$). For example, in a 3D memory device, the set of adjacent wordlines can include a wordline located directly above the target wordline and/or a wordline located directly below the target wordline.

Accordingly, each specified cell can have a respective group of adjacent cells. Each group of adjacent cells can include at least one cell that neighbors its respective specified cell (e.g., one cell connected to $WL_{n-1}$ and/or one cell connected to $WL_{n+1}$). More specifically, each specified cell can be connected to the same bitline as each cell of the respective group of adjacent cells, such that the specified cell and the cells of the respective group of adjacent cells are within the same string. Accordingly, each group of adjacent cells can include a single adjacent cell, or a pair of adjacent cells connected to a same bitline as a respective specified cell.

Some memory devices are subject to physical phenomena that affect the charge stored in their cells and consequently, also affect the respective threshold voltages of the cells. These phenomena can arise in a memory array between one or more specified cells and their respective groups of adjacent cells. A couple of such phenomena are referred to herein as cell-to-cell coupling (i.e., capacitive coupling between cells that causes interference) and lateral migration (i.e., charge migration between adjacent cells). Cell-to-cell coupling between cells occurs due to capacitive coupling between charge storage structures (e.g., floating gates) of adjacent memory cells. For example, the $V_t$ of a specified cell programmed to a target state (e.g., a particular programming level) can change due to capacitive coupling associated with floating gates of adjacent cells. The amount of $V_t$ change (i.e., $V_t$ shift), of the specified cell due to cell-to-cell coupling can depend on the $V_t$ of one or more adjacent cells. For instance, adjacent cells programmed to a higher programming level (i.e., a state associated with a higher $V_t$) may have a greater effect on the $V_t$ of the specified cell than adjacent cells programmed to a lower programming level (i.e., a state associated with a lower $V_t$). In some instances, the $V_t$ shift of a specified cell caused by the programming of an adjacent cell, can lead to erroneous sensing (e.g., during a memory access operations) of the specified cell.

Lateral migration can have analogous effects. For example, after a cell adjacent to a specified cell is programmed, the electrons can diffuse laterally (i.e., along the wordline) from the charge storage structure of the adjacent cell toward the charge storage structures of the specified cell by tunneling through intervening layers between them. Moreover, this diffusion can depend on (i.e., may be a function of) the respective programming level of neighboring cells connected to the same bitline as the specified cell. Consequently, lateral migration of charge (i.e., as a function of time and of the programming levels of the adjacent cells on the bitline) from an adjacent cell on the wordline can also shift the $V_t$ of the specified cell due to the loss of charge (i.e., electrons) that was previously present.

Accordingly, both cell-to-cell coupling and lateral migration can lead to significant $V_t$ shifts which can depend on the programming level of adjacent cells along the bitline of a specified cell. For example, the shift can be sufficient to cause a memory access operations performed on the specified cell to result in a determined sensed state other than the one associated with the programming level of the specified cell. Consequently, for a given programming level, the cells in the memory device can be characterized by multiple $V_t$ sub-distributions with each sub-distribution being associated with (e.g., caused by) a particular programming level of an adjacent cell (e.g., via one of the aforementioned phenomena). The mean of each of these distributions will be shifted from the default $V_t$ for a given programming level by an amount correlated with the programming level of the corresponding group of adjacent cell(s). Thus, when these effects are considered for a multiple cells in one or more memory arrays on a memory device, these phenomena can result in a lowering and widening of the $V_t$ distribution for any programmed state and therefore impair the ability to accurately read the cells. The $V_t$ distribution widening can, in turn, cause RWB degradation and negatively affect memory device reliability. For example, RWB degradation can lead to an increase in the number of errors (e.g., bit errors) and/or error rate (e.g., bit error rate (BER)).

More specifically, cell-to-cell coupling and lateral migration can entail a change in $V_t$ of one transistor (e.g., of a memory cell) influencing the $V_t$ of one or more neighboring transistors (e.g., of a memory cell) to shift through a parasitic capacitance-coupling effect. These $V_t$ shifts disadvantageously results in an expansion of the corresponding $V_t$ distributions (i.e., of multiple cells in an array) in order to accommodate all possible threshold voltages for a given state and further results in a reduction of the RWB corresponding to the programming distributions associated with the various programming levels. Notably, the RWB can refer to the cumulative value (e.g., in voltage) of a number (e.g., seven) of distances (e.g., measured in voltage) between adjacent threshold voltage distributions at a particular BER. For the purposes of this disclosure, in the context of cell-to-cell coupling and lateral migration phenomena, a cell whose $V_t$ is affected by the programming level of a neighboring cell can be referred to herein as a "victim" cell. Analogously, in the same context, a cell whose programming level affects the $V_t$ of a neighboring cell can be referred to herein as an "aggressor" cell.

In some situations, the effects of cell-to-cell coupling and lateral migration can be mitigated by compensation during read operations or programming (i.e., write) operations that are performed on the cells of the memory device. More specifically, adjustments can be made to voltages applied to a cell in the course of read operations and write operations to compensate for the multiple shifted $V_t$ sub-distributions created due to the effects of corresponding programming levels of one or more adjacent aggressor cells. These adjusted voltages (e.g., a read reference voltage or a program-verify voltage) applied in the course of such memory access operations can be offset (e.g., in an opposite direction) relative to the $V_t$ of a specified cell to counteract the effects of cell-to-cell coupling and lateral migration. In general, each possible $V_t$ shift of a specified memory cell caused by one or more adjacent aggressor cell's programming level can be accounted by shifting the means (i.e., mathematical averages) of the resulting $V_t$ sub-distributions closer together or even by aligning them completely. This alignment can be achieved during programming of the cell by applying offset programming voltage pulses and PV voltages to the cell such that the resulting $V_t$ of the cell aligns with the desired target value due to effect of cell-to-cell coupling and lateral migration. Similarly, an alignment of sensed $V_t$ can be achieved when reading a cell by offsetting a read reference voltage such that the perceived sensed state's $V_t$ aligns with the desired target value after the effect of cell-to-cell coupling and lateral migration is considered. Accordingly, the respective means of the sub-distributions can be shifted and aligned by applying one or more adjusted voltages to the specified memory cell during a memory access operation. Shifting the means of the sub-distributions closer together compensates for the widening of the overarching distribution for a given specified cell programming level caused by cell-to-cell coupling and lateral migration effects of the aggressor memory cells.

However, the number and the parameters of the adjustments to the voltages applied during a memory cell access operation to compensate for the aforementioned effects can vary depending on multiple factors. For example, (i) the geometry of the array of memory cells; (ii) the sensitivity of a victim memory cells to an aggressor cell state; (iii) the programming level of a victim cell, (iv) the programming level of an aggressor cell, (v) the desired (i.e., target) RWB, the (vi) amount (e.g., in bits) of information about the aggressor cell programming levels that is to be used; (vii) the amount of energy used; and (vii) the amount of time used can each determine how a memory cell access operation is modified to compensate for the cell-to-cell coupling and lateral migration effects. Accordingly, the modification of the default parameters (e.g., adjustment of applied voltage levels) of the memory cell access operation can be tailored to achieve a desired RWB increase based on constraints relating to one or more of the aforementioned factors. The modifications of these parameters can depend on determining the programming levels of the specified cell and the neighboring cell in order to select an appropriate adjustment that accurately compensates for the effects on the specified cell.

Furthermore, in some cases, different cells on a memory device can have be differently affected by the cell-to-cell coupling and lateral migration phenomena. More specifically, the shift in $V_t$ of some cells in the device (caused by an adjacent cell at programming level N) will be greater in magnitude for some cells than for others. Accordingly, some victim cells can be said to be more sensitive to the changes in the programming level of adjacent aggressor cells and therefore have a higher aggressor cell programming state dependence. Consider that for each programming level of an adjacent aggressor cell there exists a corresponding victim cell $V_t$ sub-distribution for a given victim cell programming level. Therefore, the further the separation (in volts) of a sub-distribution attributable to the lowest aggressor memory cell programing level from the sub-distribution attributable to the highest aggressor memory cell programing level, the more sensitive the victim cell is to the aggressor memory cell state. Thus, a spread, defined as a difference between the mean of sub-distribution attributable to the highest aggressor memory cell programing level and the mean of the sub-distribution attributable to the lowest aggressor memory cell programing level can serve as a measure of a victim cells $V_t$ sensitivity or dependence on an aggressor cell programming level. Notably, in some cases, victim cells connected to a common wordline tend to have similar sensitivities to aggressor cell programming levels while victim cells connected to different wordlines tend to have different sensitives.

Thus, modifying the memory access operation can entail having to perform multiple operations on the specified cell and adjacent cells to determine the parameter adjustments that would accurately compensate for the cell-to-cell coupling and lateral migration effects. Due to this, the level of precision that is needed to determine the aggressor cell programming levels is directly correlated with the time it takes to make that determination. Accordingly, achieving a large RWB increase or a corresponding decrease in BER can require a proportionally longer amount of time.

Further, in some systems, when an error is encountered during a read operation (e.g., a hard read failure) with respect to a memory cell of when a BER with respect to multiple cells on the memory device is exceeded, a sequence of error handling operations (also referred to as a sequence of recovery steps) can be undertaken. This sequence can include performing a corrective read operation followed by a soft bit read operation (both operations collectively referred to herein as "compensatory operations"). A corrective read operation can include applying one or more adjusted read reference voltages (e.g., voltages offset from a default read reference voltage by a predetermined amount) to determine the programming state of the specified cell (depending on the programming level of an adjacent aggressor cell). A soft bit read operation can include applying one or more voltage pulses that are offset from the default read reference voltage to increase the confidence in the sensed state (i.e., programming level) of the specified cell. Furthermore, a soft bit read operation can be combined with a corrective read operation such that the corrective read operation is performed as part of the soft bit read operation.

However, this can often be an extremely resource intensive approach due to the additional operations needed to determine the modified parameters (e.g., adjusted voltages) for use with the memory access operation. Consequently, compensation of these effects during compensatory operations leads to increased time (e.g., tRead) needed to complete respective corrective read operations and can significantly delay the transmission of data to the host device. Furthermore, in many cases, attempting to compensate for the cell-to-cell coupling and lateral migration effects might not achieve the desired decrease in BER. For example, for cells that are not very sensitive to the cell-to-cell coupling and lateral migration effects caused by an adjacent cell's programming level, attempts to compensate for these phenomena with corrective read operations might not be effective. Accordingly, in such cases it would be wasteful to expend resources and time on compensation (e.g., corrective read operations) that would not practically result in the desired performance improvement (e.g., decreased BER). Therefore, in such situations sequence of error handling operations that includes corrective read operations adjusted to compensate for these effects would detrimentally increase data transfer latency between the memory device and host device without providing a corresponding decrease in BER.

Aspects of the present disclosure address the above and other deficiencies by balancing the resource and time demands of modifying memory access operations (e.g., corrective read operations) to compensate for cell-to-cell (C2C) coupling and lateral migration (LM) effects with the aggressor cell programming level sensitivity of victim cells connected to particular wordlines. The various embodiments described herein enable efficient error handling to compensate for the aforementioned detrimental C2C coupling and LM effects based on the sensitivity to those effect. In general, in the embodiments, this is accomplished by determining how sensitive the memory cells are (i.e., how sensitive the $V_t$ of a group of victim cells is) with respect to aggressor memory cell states (i.e., the programming levels of one or more aggressor memory cells adjacent to respective victim cells) and basing subsequent compensatory operations based on that sensitivity. As noted above, the effectiveness of compensatory operations can depend on a variety of interrelated factors representative of the physical properties of the constituent elements (e.g., victim cell sensitivity) of a memory device and of its desired performance characteristics (e.g., target BER).

Taking these factors into consideration, the embodiments of the present disclosure group wordlines based on the sensitivity of the cells respectively connected to those wordlines to the programming levels of adjacent aggressor memory cells so that compensatory operations can be performed accordingly. Since cells connected to the same wordline tend to have similar sensitivities, each wordline can be associated with a corresponding level of sensitivity. The embodiments can use an aggregate aforementioned spread value (i.e., spread between sub-distribution means) of the cells on the wordline for a specified victim cell programming level as an indicator of this sensitivity. Some embodiments can categorize or group wordlines into high sensitivity and low sensitivity groups where each group has wordlines based on whether the aggressor memory cell programming level sensitivity of the victim cells connected to the wordline satisfy a threshold criterion (e.g., have a sensitivity level value above a predetermined threshold value). Wordlines with high sensitivity can be referred to herein as "weak" wordlines while wordlines with low sensitivity can be referred to as "strong" wordlines. Several embodiments can store a record of the respective sensitivities and corresponding grouping of the wordlines on the memory device to be used as a reference for performing compensatory operations. For example, in some cases if an error is encountered during read operations with respect to a memory cell on a strong wordline, the compensatory operations can include soft bit read operation being performed on the memory cell without any corrective read operations being performed. In contrast, if an error is encountered during read operations with respect to a memory cell on a weak wordline, the compensatory operations can include a corrective read operation being performed followed by a soft bit read operation if the corrective read operation does not resolve the error.

Advantages of the embodiments of the present disclosure include, but are not limited to, conservation of resources when compensating for the effects of C2C coupling and LM. For example, a less resource intensive approach is implemented to reduce the time needed to complete the respective compensatory operations based on wordline sensitivity to these effects. Accordingly, resources and time are conserved for compensatory operations in cases where extensive corrective reads might be ineffective and are efficiently used in cases where they will result in a sufficient BER decrease. Thus, the embodiments disclosed herein improve the efficiency of compensatory operations (e.g., remedial modifications to read operations that compensate for C2C coupling and LM effects) by reducing the time and energy used for error handling. These and other elements and features of the embodiments are described initially with reference to FIG. 1 and FIGS. 2A-2D below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device The memory sub-system 110 includes a compensation management component (CMC) 113 that can optimize compensatory operation sequences including corrective read operations and soft bit read operations to compensate for C2C coupling and LM effects on cells in the memory device 130. In some embodiments, the memory sub-system controller 115 includes at least a portion of the CMC 113. In some embodiments, the CMC 113 is part of the host system 110, an application, or an operating system. In other embodiments, local media controller 135 includes at least a portion of CMC 113 and is configured to perform the functionality described herein The CMC 113 can manage compensatory operations performed on the memory cells of memory device 130 to account for the effects of C2C coupling and LM based on the sensitivity of the victim cells on particular wordlines to aggressor memory cell programming levels. Further details with regards to the operations of the CMC 113 are described below with additional reference to FIGS. 2A-2D which depict an example memory cell arrangement, the effects of C2C coupling and LM, as well as example results of compensation.

Figure 2A:
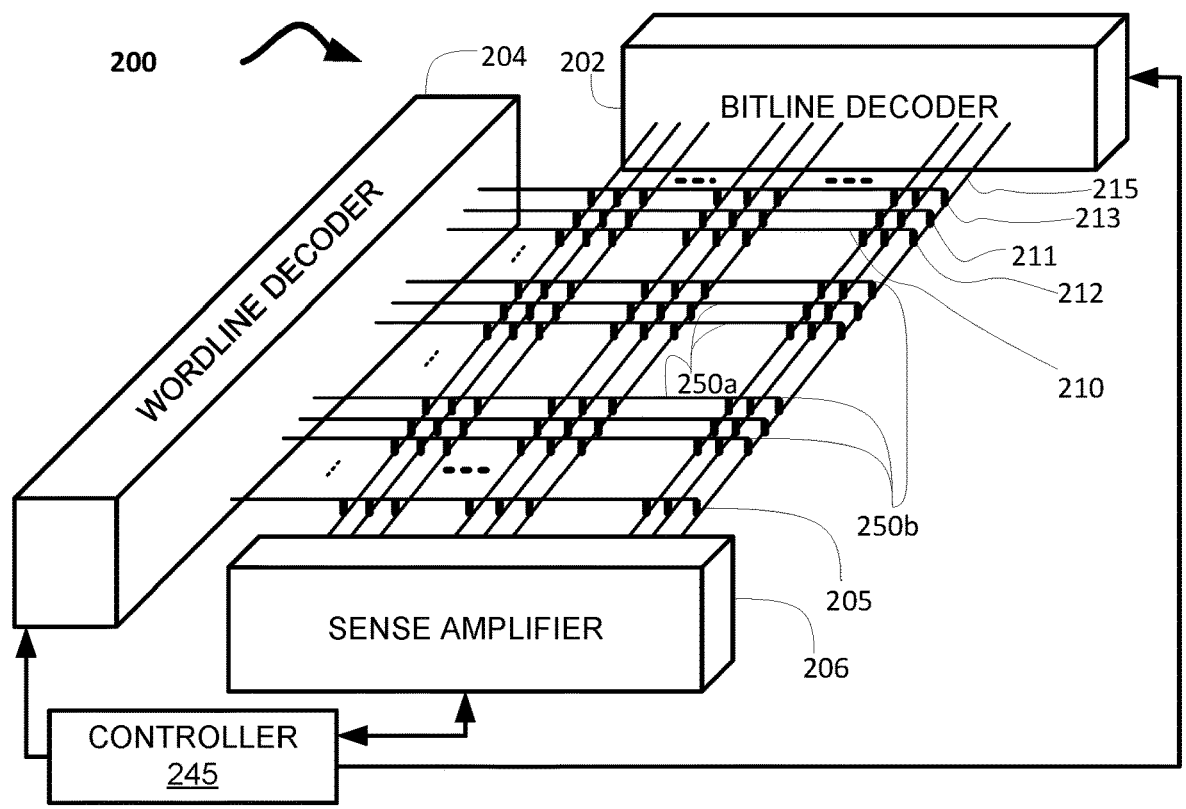
FIG. 2A illustrates an example array of memory cells in accordance with some embodiments of the present disclosure.
Figure 2B:
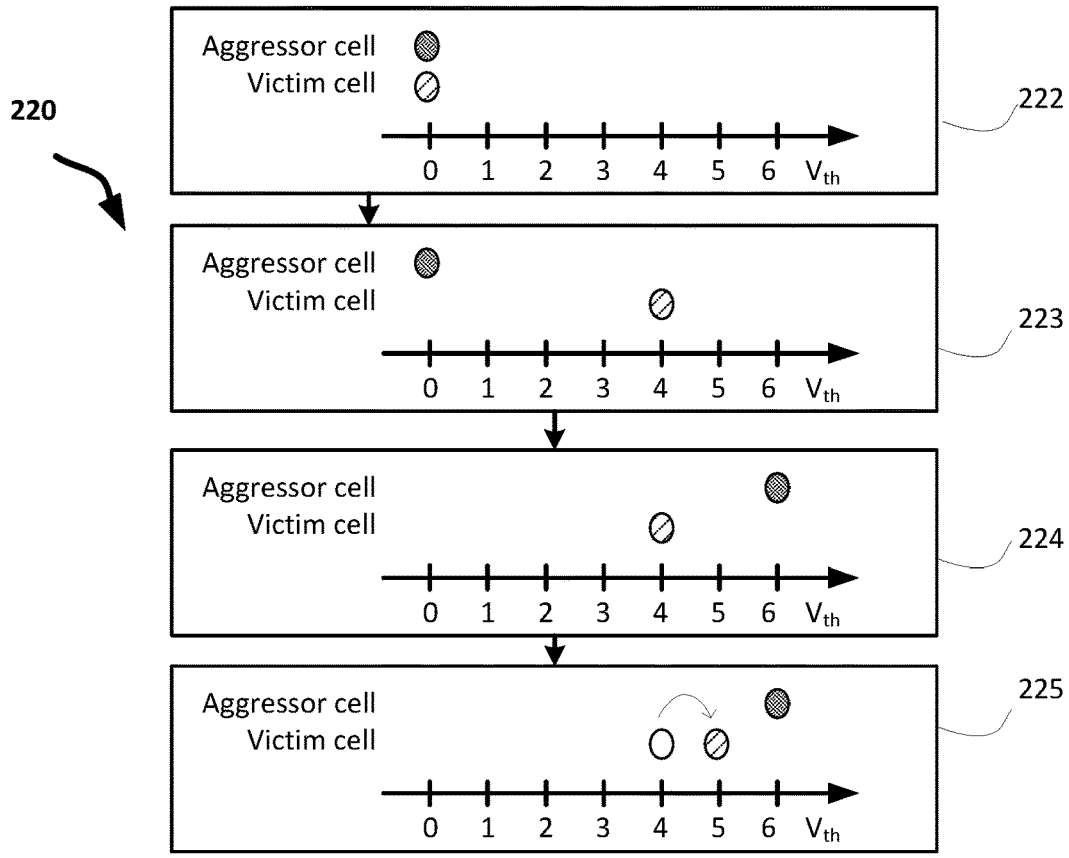
FIG. 2B is a flow chart showing the effects of an aggressor memory cell programming level on the threshold voltage of a victim memory cell in accordance with some embodiments of the present disclosure.
Figure 2C:
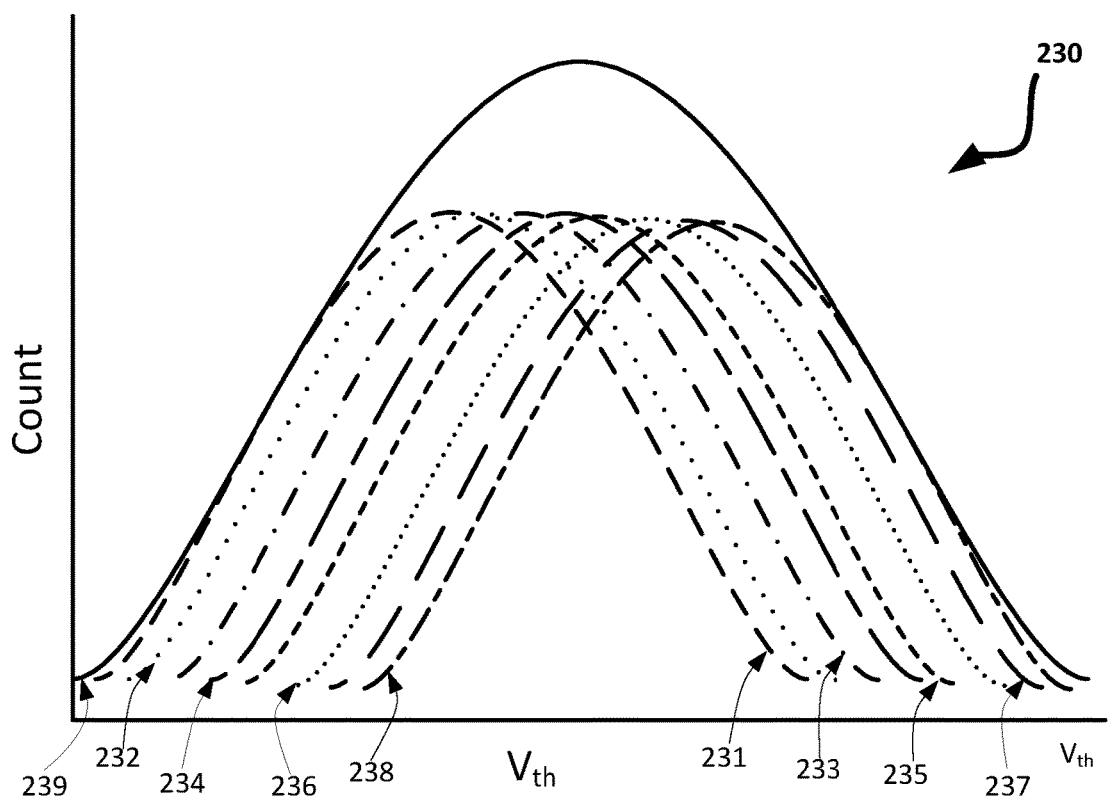
FIG. 2C illustrates an example threshold voltage distribution and its sub distributions in accordance with some embodiments of the present disclosure.
Figure 2D:
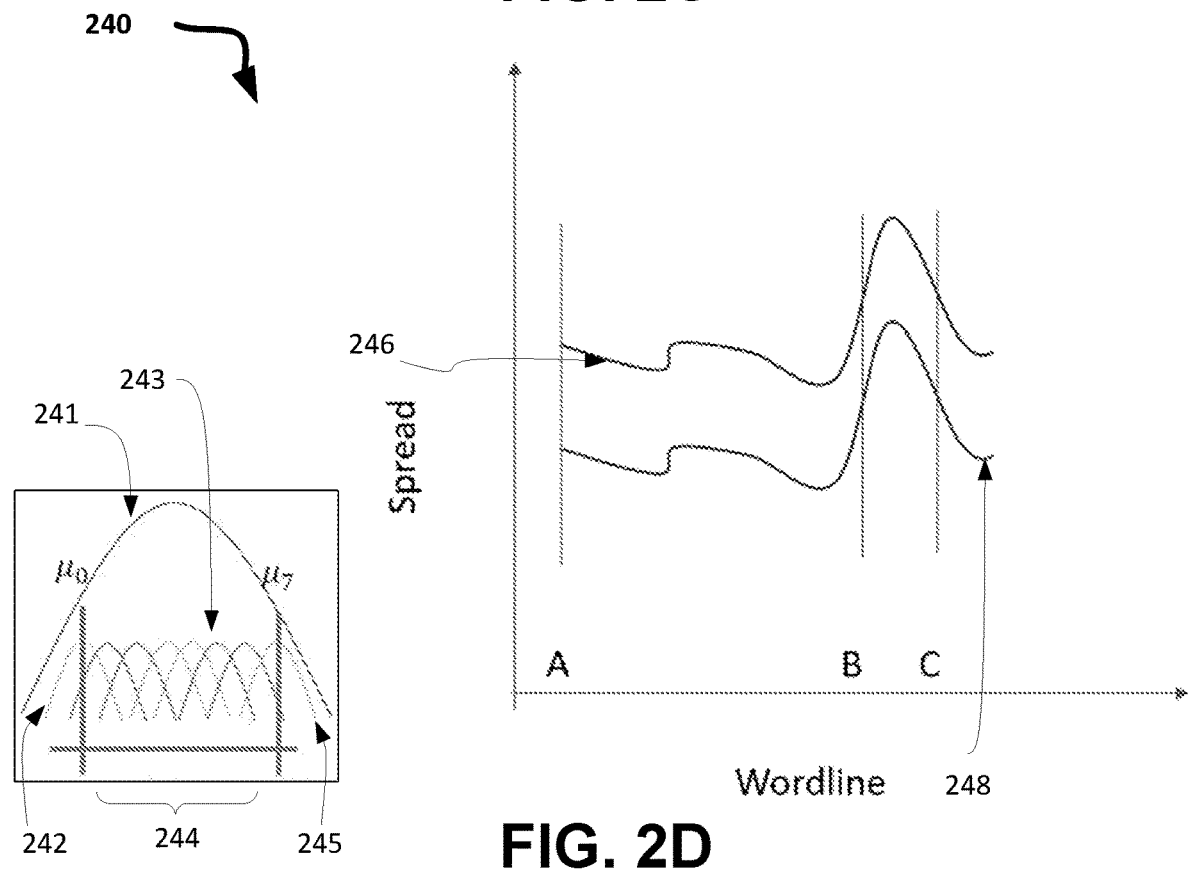
FIG. 2D depicts a spread of a plot of a threshold voltage distribution determined by its sub distributions and a plot of spreads as a function of wordline index number in accordance with some embodiments of the present disclosure.

To further describe the features of CMC 113, consider an array 200 of multiple TLC memory cells 205, 211, 212, 213 illustrated in FIG. 2A in accordance with some embodiments of the present disclosure. Memory array 200 can include multiple wordlines 210 (e.g., row lines) and multiple bitlines 215 (e.g., column lines, pillars), labeled. In some embodiments, each row of memory cells 205, 211, 212, 213 is connected to a wordline 210, and each column of memory cells 205, 211, 212, 213 is connected to a bitline 215. Activating or selecting a wordline 210 or a bitline 215 can include applying a voltage to the respective lines.

Wordlines 210 and bitlines 215 can be substantially perpendicular (i.e., orthogonal) to one another or otherwise intersect one another to create an array of memory cells. As shown in FIG. 2A, one memory cell 212 can be located at the intersection of two conductive lines such as a wordline 210 and a bitline 215. This intersection can be referred to as an address of a memory cell 212. A specified memory cell 212 can be a memory cell 212 located at the intersection of an energized wordline 210 and bitline 215; that is, wordline 210 and bitline 215 can be energized to read, write, or otherwise access a memory cell 212 at their intersection. Other memory cells 205, 211, 213 that are in electronic communication with (e.g., connected to) the same wordline 210 or bitline 215 can be referred to as unspecified memory cells 205, 211, 213.

Electrodes can be coupled to a memory cell 205, 211, 212, 213 and a wordline 210 or a bitline 215. The term electrode can refer to an electrical conductor, and in some embodiments, can be employed as an electrical contact to a memory cell 205, 211, 212, 213. An electrode can include a trace, wire, conductive line, conductive layer, or the like that provides a conductive path between elements or components of memory device 130. In some examples, a memory cell 205, 211, 212, 213 can include multiple self-selecting or other memory components (e.g., a selection component and a storage component) separated from each other and from access lines 210, 215 by electrodes. For self-selecting memory cells 205, 211, 212, 213, a single component (e.g., a section or layer of chalcogenide material within the memory cell 205, 211, 212, 213) can be used as both a storage element (e.g., to store or contribute to the storage of a state of memory cell 205) and as a selector element (e.g., to select or contribute to the selection of the memory cell 205, 211, 212, 213).

In some embodiments, operations such as reading and writing can be performed on memory cells 205, 211, 212, 213 by activating or selecting a corresponding wordline 210 and bitline 215. Accessing memory cells 205, 211, 212, 213 can be controlled through a wordline decoder 204 and a bitline decoder 202. For example, a wordline decoder 204 can receive a row address from the memory controller 245 (which can be a version of memory sub-system controller 110 or CMC 113 of FIG. 1) and activate the appropriate wordline 210 based on the received row address. Such a process can be referred to as decoding a row or wordline address. Similarly, a bitline decoder 202 can receive a column address from the memory controller 245 and activate the appropriate bitline 215. Such a process can be referred to as decoding a column or bitline address. A wordline decoder 204 and/or bitline decoder 202 can be examples of decoders implemented using decoder circuitry, for example. In some embodiments, wordline decoder 204 and/or bitline decoder 202 can include circuitry that is configured to increase a voltage applied to a wordline 210 or bitline 215 (respectively).

In some embodiments, a memory cell 205, 211, 212, 213 can be read (e.g., sensed) by a sense amplifier 206 when the memory cell 205, 211, 212, 213 is accessed (e.g., in cooperation with the memory controller 245, wordline decoder 204, and/or bitline decoder 202) to determine a logic state stored by the memory cell 205, 211, 212, 213. The sense amplifier 206 can provide an output signal indicative of (e.g., based at least in part on) the logic state stored by the memory cell 205, 211, 212, 213 to one or more components (e.g., to the bitline decoder 202, the memory controller 245). In some embodiments, the detected logic state can be provided to a host system 120 (e.g., a device that uses the memory device 130 for data storage), where such signaling can be provided directly from the memory controller 245, memory sub-system controller 115, or CMC 113.

In some embodiments, sense amplifier 206 can include various transistors or amplifiers to detect and amplify a difference in signals obtained based on reading a memory cell 205, 211, 212, 213, which can be referred to as latching. The detected logic state of memory cell 205, 211, 212, 213 can then be output through bitline decoder 202 as output. In some embodiments, sense amplifier 206 can be part of a bitline decoder 202 or row decoder 120. Alternatively, sense amplifier 206 can be connected to or in electronic communication with bitline decoder 202 or wordline decoder 204.

In some embodiments, read/write/erase operations can be performed on memory cells 205, 211, 212, 213. The performance of such operations can be controlled by memory controller 245 (which can be a version of memory sub-system controller 110 or CMC 113 of FIG. 1). Accordingly, operations, such as write operations to be performed on memory array 200 can be distributed among the memory cells 205, 211, 212, 213. In one embodiment, the wordlines 210 can be grouped according to a value of a metric reflecting a property or characteristic of the memory cells of the group (e.g., a default voltage that needs to be applied to program the cells of the wordline to a particular programming level). For example, one such metric might be a value of a distribution spread reflecting the sensitivity of victim memory cells programmed to a particular programming level to different aggressor memory cell states. In the embodiment depicted in FIG. 2A, some of the wordlines 210 of array 200 can be grouped into a first group 250a that have cells with a $V_t$ distribution spread of X for programing level 2, and a second group 250b that have cells with a $V_t$ distribution spread of Y for programing level 2. Each of the groups can have a value of a metric that that reflects a property or characteristic of the memory cells in the group falling within a range of possible values. In other words, wordlines with spreads (i.e., spreads of victim cell $V_t$ sub-distributions corresponding to respective different programming levels of adjacent aggressor memory cells) within one range of values can be included in one group while wordlines with spreads within a different range of values can be included in a different group.

In the several embodiments, the default parameter values used to program or read memory cells 205, 211, 212, 213 at a particular programming level can be adjusted to compensate for the effects of C2C coupling and LM described above. As explained in more detail below with reference to FIGS. 3-5, the voltages used to read a cell on can be offset by a predetermined amount to compensate for the effects of aggressor memory cells and to correctly sense the programming state of the cell.

Take for example, memory cell 211 that is specified to be accessed by a memory access operation (e.g. read/write) by specifying and activating the respective bitline and wordline at the intersection of which it is located. The specified wordline can be referred to as an n-th wordline ($WL_n$), and the adjacent wordlines can include adjacent wordline n−1 ($WL_{n-1}$) and adjacent wordline n+1 ($WL_{n+1}$). Thus, the specified cell 211 can have a respective group of adjacent cells. Each group of adjacent cells can include at least one cell that neighbors its respective specified cell (e.g., one cell 212 connected to $WL_{n-1}$ and/or one cell 213 connected to $WL_{n+1}$). The memory cells 205 can be categorized into aggressor cells and victim cells. More specifically, an aggressor memory cell can be defined by an effect its programming level has on a threshold voltage of an adjacent memory cell. The adjacent cell can thus be defined as the victim cell as it is affected by the programming level of the aggressor cell. This categorization and relationship is depicted in the flow chart of FIG. 2B.

In the depicted example, memory cell 211 can be subject to the effects of phenomena such as LM and C2C coupling. If memory cell 211 is subject to an effect of a programming level of its adjacent cell 212, then memory cell can be considered to be the victim cell 211 and the adjacent cell 212 can be considered to be the aggressor cell 212. Initially, at block 222, both cells have a $V_t$ of 0. When the victim cell 211 is programmed, at block 223, to have a $V_t$ of 4v, it might not yet be affected by the programming level of the aggressor memory cell 212 since the aggressor memory cell 212 still has a $V_t$ of 0v. Thereafter, the C2C coupling effect can become observable as the aggressor memory cell 212 is programmed at block 224 to have a $V_t$ of 6v. As can be seen in block 225, the $V_t$ of the victim cell 211 can increase from 4v to 5v caused by the programming level corresponding to the aggressor memory cell's $V_t$ of 6v due to C2C coupling. In a similar manner, the $V_t$ of victim memory cell 211 can be affected by the programming level (i.e., by the corresponding $V_t$) of adjacent aggressor cell 213.

Thus, in the various embodiment the CMC 113 can compensate for the resulting distributions of $V_t$ of victim cells caused by aggressor cell programming levels. Take for example, a plot 230 of victim cell $V_t$ depicted in FIG. 2C in accordance with an embodiment of the disclosure. The example plot 230 of $V_t$ distributions is associated with of an example group of TLC memory cells (e.g., cells 205, 211, 212, 213) programmed to programming level 3. As can be seen, the overarching distribution 239 of $V_t$ for the cells programmed to programming level 3 includes multiple sub-distributions 231-238. Each of these sub-distributions 231-238 reflect the $V_t$ of victim cells programmed to level 3 that happen to have an adjacent aggressor memory cell programmed to a particular programming level that shifts the respective $V_t$ of the victim cell. For example, sub-distribution 231 is a distribution of $V_t$ that is not shifted because the adjacent aggressor cells of the victim cells in the distribution are programmed to programming level 0. In contrast, sub-distribution 232 is shifted due to aggressor memory cells programmed to programming level 1. Sub-distribution 233 is shifted due to aggressor memory cells programmed to programming level 2. Sub-distribution 234 is shifted due to aggressor memory cells programmed to programming level 3. Sub-distribution 235 is shifted due to aggressor memory cells programmed to programming level 4. Sub-distribution 236 is shifted due to aggressor memory cells programmed to programming level 5. Sub-distribution 237 is shifted due to aggressor memory cells programmed to programming level 6. Sub-distribution 238 is shifted due to aggressor memory cells programmed to programming level 7.

Accordingly, it can be seen how the $V_t$ distribution for a set of victim memory cells has sub-distributions of $V_t$ dependent on the programming level of aggressor memory cells. For example, the sub-distribution 238 is shifted to the right relative to the default sub-distribution 231 by a greater amount than sub-distribution 234. This is because the victim cells of sub-distribution 238 are adjacent to aggressor cells of a higher programming level (i.e., 7) than those of sub-distribution 234. Notably, variations of the depicted shifts that are shown for one victim cell programming level can also exist for other programming levels of the victim cell. The other programming levels of the victim cells can likewise be affected by the programming levels of adjacent aggressor cells and have corresponding shifts in their respective sub-distributions.

Thus, in some embodiments, CMC 113 can compensate for these $V_t$ shifts by taking these shifts into consideration when performing compensatory operations (e.g., a sequence of one or more corrective read operations and soft bit read operations) on the specified memory cells. In these embodiments, the parameters used in the operations and the sequence of such operations can depend on the sensitivity of the victim cells connected to a particular wordline to the programming level of the adjacent aggressor memory cells. As noted earlier, this sensitivity can be reflected by a spread of a distribution such as the overarching distribution 239 one depicted in FIG. 2C. An example plot showing the determination of the spread 244 of a similar distribution 241 is depicted on the left side of FIG. 2D in accordance with an embodiment of the disclosure. For example, overarching $V_t$ distribution (i.e., for a set of victim memory cells at programming level N) can include multiple sub-distributions 243. Each of the sub-distributions can be shifted by a different amount based on a corresponding aggressor cell programming level. In some embodiments, CMC 113 can determine the sensitivity of the victim cells to the programming level of adjacent aggressor cells by calculating the spread of the distribution 241 defined as the difference between the mean to of the sub-distribution 242 attributable to the lowest aggressor memory cell programing level and the mean $\mu_7$ the sub-distribution 245 attributable to the highest aggressor memory cell programing level compensate.

Furthermore, in some embodiments, the sensitivity (e.g., as reflected by the distribution spread) of a set of victim cells on a particular wordline to adjacent aggressor memory cells at programming level M can differ from the sensitivity of the same set of cells on the same wordline to adjacent aggressor memory cells at programming level N. Accordingly, in these embodiments, CMC 113 can determine the sensitivity (e.g., in terms of spread) of each of the victim cells on each of the word lines to different programming levels of adjacent aggressor memory cells. A couple plots of spreads (i.e., victim cell sub-distribution spreads defined by the means of the corresponding lowest and highest sub-distributions) for a couple of different victim memory cell programming levels. The plots represent spread for a given victim cell programming level as a function of wordline index number. For example, plot 246 is a plot of the spread of the victim memory cell $V_t$ distributions for victim memory cells programmed to programming level 1. Similarly, plot 248 is a plot of the spread of the victim memory cell $V_t$ distributions for victim memory cells programmed to programming level 7. Thus, it can be seen that not only do different victim cells have different sensitivities to depending on which wordline they are connected to, but that they also have different sensitivities depending on the programming level to which the victim cells are programmed. Moreover, in the depicted examples, it can be seen that victim cells connected to wordlines in the region between B and C have a generally higher aggressor programming level dependence (i.e., have $V_t$ distribution that are more sensitive to adjacent aggressor memory cell programming levels) than the victim cells connected to wordlines in the range between A and B. Accordingly, in some embodiments, the CMC 113 performing corrective read operations to reduce BER by compensating for the C2C coupling and LM effects would be less effective for the wordlines in the range between A and B than for the wordlines in the range between B and C.

In some embodiments, to compensate for the shifts (i.e., sub-distributions), CMC 113 can perform corrective read operations (e.g., adjust read reference voltages applied during the read operations that are offset by an amount corresponding to the respective shifts). This can entail ensuring that a read reference voltage falls within a valley between distributions and does not inadvertently fall within one of the shifted sub-distributions 243.

Because each shift depends on a particular programming level of an aggressor memory cell, a larger number of possible aggressor memory cell programming levels will entail a larger number of possible shifts to be accounted for.

Notably, the BER decrease (e.g., based on a corresponding RWB increase) achieved with compensation by corrective read operation can be directly correlated with the aggressor cell dependence (i.e., sensitivity to aggressor cell programming levels) of the cells on the wordlines on which the corrective read operations are to be performed. In other words, the higher a wordline's aggressor memory cell dependence, the more effective the corrective read operations performed by CMC 113 for compensation, and vice versa. Furthermore, the greater the number of possible aggressor memory cell states that a corrective read operation (e.g., defined by the number of bits needed to represent those states) might need to compensate for, the larger the cost (i.e., in terms of computing resources and time) of the compensation. For example, a 1-bit corrective read operation entails 1 read at the aggressor cell to determine its state and 2 possible reads at the victim cell (i.e., including each adjusted read reference voltage to account for each possible aggressor memory cell programming state) for a total of 3 reads. Similarly, a 2-bit corrective read operation entails 3 read at the aggressor cell to determine its state and 4 possible reads at the victim cell (i.e., including each adjusted read reference voltage to account for each possible aggressor memory cell programming state) for a total of 7 reads. Analogously, a 3-bit corrective read operation entails 7 read at the aggressor cell to determine its state and 8 possible reads at the victim cell (i.e., including each adjusted read reference voltage to account for each possible aggressor memory cell programming state) for a total of 15 reads. This relationship can be generalized by stating that an n-bit corrective read operation entails $2^n-1$ reads at the aggressor memory cell (to account for all the aggressors except the first one which doesn't affect victim cell), and up to $2^n$ adjusted reads at the victim, for a possible total of $2^{n+1}-1$ reads. Accordingly, in some embodiments, when the benefit from a decrease in BER is outweighed by the resources expended on corrective read operations, it can be more efficient to exclude corrective read operations from a sequence of compensatory operations that are performed when an error is encountered during a memory access operation with respect to a memory cell.

Thus, to increase efficiency of error handling in some embodiments, the CMC 113 can determine a value of a sensitivity metric for each memory cell 205 connected to each wordline 210 of an array in a memory device. The value of the metric can reflect the sensitivity of the threshold voltage associated with the memory cell to a change in a threshold voltage of an adjacent cell. For example, in some embodiments, the metric can be a spread of an overarching $V_t$ distribution for a given victim cell programming level defined as the difference between the mean of the $V_t$ sub-distribution attributable to adjacent aggressor memory cells programmed to the highest possible level and the mean of the $V_t$ sub-distribution attributable to adjacent aggressor memory cells programmed to the lowest possible level. In other implementations, the metric can, for example, be a standard deviation or another measure of dispersion such as range, interquartile range, and variance.

In the several embodiments, based on the determined sensitivity (e.g., corresponding to the sensitivity metric) for each memory cell, the CMC 113 can determine, for each wordline, a respective aggregate measure of adjacent cell dependence. For example, the CMC 113 can aggregate the sensitivity metrics of all the cells on a given wordline and determine a sensitivity metric for that wordline that is reflective of the dependence of the states of the victim cells on that wordline to the programming levels of aggressor cells on adjacent wordlines. In some embodiments, the CMC 113 can compare, for each wordline, the determined aggregate measure of adjacent cell dependence to a threshold dependence value. For example, the CMC 113 can determine whether the aggregate measure is higher or lower than a predetermined threshold value representative of adjacent cell dependence.

In some embodiments, the CMC 113 can divide the wordlines into wordline groups based on their respective determined measures of aggressor cell dependence. For example, the CMC 113 can identify a group of wordlines that includes wordlines having a measure of adjacent cell dependence that is higher than the threshold dependence value. Similarly the CMC 113 can identify another group of wordlines that includes wordlines having a measure of adjacent cell dependence that is lower than the threshold dependence value. In other embodiments, the CMC 113 can compare the respective wordlines' aggregate measures of adjacent cell dependence to multiple threshold values and group the wordline into several groups depending on whether the respective measures are greater or less than the respective threshold dependence values. In some embodiments, the CMC 113 can create a record of the wordlines in each group so that the record can be referenced to decide how to handle an error that occurs during a memory access operation performed on a cell connected to one of the wordlines. For example, in embodiments where the wordlines are grouped into only two wordline groups, the CMC 113 can store on the memory device, a record referencing the wordlines of the first group, the wordlines of the second group, or the wordlines of both groups along with an indication of which group the wordlines belong to. If the CMC 113 divides the wordlines into only two wordline groups, storing a record referencing the wordlines included in only one of the wordline groups is sufficient since the remaining wordlines can be assumed to be in the other wordline group. In some embodiments, the CMC 113 can indicate (e.g., via an index, coordinate, or other indicator) in the record a location on the die of the memory device for each wordline in the corresponding wordline group.

In the course of its operation the memory sub-system 110 can encounter errors during the performance of memory access operations on the cells of the memory device 130. In some embodiments, in response to encountering an error during a read operation with respect to a specified memory cell, the CMC 113 can determine based on the stored record whether the specified memory cell is connected to one of the wordlines in the first wordline group or to one of the wordlines in the second wordline group. Accordingly, the CMC 113 can determine whether the error is encountered on a cell connected to a weak wordline or a strong wordline in accordance with the group that includes the wordline to which the cell is connected.

If the CMC 113 determines that the specified memory cell is connected to one of the wordlines in the first wordline group (i.e., for which the aggregate sensitivity metric such as spread identifies the wordline as weak WL which can benefit from corrective read operations), the CMC 113 can respond by applying an adjusted read voltage to the specified memory cell based on a measure of threshold voltage shift caused by an adjacent memory cell. The application of the adjusted read voltage can be a part of the CMC 113 performing a corrective read operation and/or a soft bit read operation. For example, the CMC 113 applying the adjusted read voltage can include applying a read reference voltage that is offset by a predetermined amount to compensate for the C2C coupling and/or LM effects on the specified cell. In other embodiments the CMC 113 applying the adjusted read voltage can be a part of one or more voltage application strobes applied during the soft bit read operation.

In some embodiments, sub-system 110 can encounter an error during the performance of memory access operations on the specified cell connected to a wordline of the first wordline group even after the CMC 113 applies the adjusted read voltage (e.g., even after the CMC 113 performs a corrective read operation that includes the application of an offset read reference voltage). In these embodiments, if the error is still encountered after a corrective read operation is performed, the CMC 113 can perform another corrective read operation with different parameters (e.g., with different read reference voltage offsets) as part of a soft bit read operation on the specified cell. Accordingly, in these embodiments, in response to encountering an error after applying the adjusted read voltage, the CMC 113 can apply a subsequent adjusted read voltage and apply at least two additional adjusted voltages (e.g., as part of a soft bit read operation) with respect to the specified memory cell (e.g., the cell connected to one of the weak wordlines that have been grouped together due to their high aggressor state dependence). In some embodiments, the voltages applied during the soft bit read operation can each be offset relative to the subsequent adjusted read voltage. In other words, in some embodiments, the soft bit read operation can include the corrective read operation together with the application of its adjusted voltage such that the soft bit operation includes the application of multiple adjusted voltages where at least some of the adjustments are to compensate for the C2C coupling and/or LM effects on the specified cell.

In other embodiments, the CMC 113 can determine that the specified cell with respect to which the performance of a memory access operation generates an error is connected to a wordline in the second wordline group (i.e., a strong wordline that has a low aggressor cell state dependence) and, in response refrain from performing a corrective read operation. Instead of the corrective read operation, in this case, the CMC 113 can perform a soft bit read operation without attempting a corrective read operation. In some embodiments, the soft bit read operation can be performed without the application of any adjusted voltages. Accordingly, in response to determining that the specified memory cell is connected to one of the wordlines in the second wordline group, the CMC 113 can perform a regular soft bit read operation and thereby apply at least two adjusted voltages with respect to the specified memory cell that are each offset relative to a default read voltage. In other words, in some embodiments, the soft bit read operation can be performed without including a corrective read operation within it or any application of its adjusted voltages (i.e., voltages adjusted to compensate for the C2C coupling and/or LM effects). While the voltages applied during a soft read operation in this case can also be offset from an initial (i.e., default) voltage, the offsets can be unrelated to compensating for the C2C coupling and/or LM effects on the specified cell. In these embodiments, performing a soft bit read operation without a corrective read operation on a specified cell that is determined to be connected to a wordline in the second wordline group can result in much lower latency than if the soft bit read operation included the corrective read and associated adjusted voltage offsets.

Thus, in some embodiments, the CMC 113 can calculate, for a wordline on a die of a memory device, an aggregate measure of sensitivity of the memory cells connected to the wordline to a change in a threshold voltage of an adjacent cell. In these embodiments, the CMC 113 can determine whether the calculated measure of sensitivity satisfies a criterion relative to a threshold value (i.e., threshold dependence/sensitivity value). For example in some embodiments the criterion can be that the calculated measure is larger than the threshold value while in other embodiments the criterion can be that the calculated measure is smaller than the threshold value. Further, the CMC 113 can determine whether an error (e.g., a read error) is encountered during a memory access operation with respect to a specified memory cell connected to the wordline. Based on that determination, in some embodiments the CMC 113 can adjust one or more voltages applied to the memory cell (e.g., during a read operation) based on the determination of whether the calculated measure of sensitivity satisfies the criterion. Notably, in any of the foregoing instances and embodiments, the adjusted read voltage (i.e., the offsets of the voltages applied by the CMC 113 during the corrective read and soft bit read operations) can depend on a number of bits of adjacent cell programming state information and on a number of wordlines that are adjacent to the wordline connected to the specified memory cell. The benefits and advantages of the various embodiments disclosed herein are described in more detail with reference to methods depicted in FIGS. 3-5.

FIG. 3 is a flow diagram of an example method 300 flow diagram of an example method for wordline grouping for error compensation in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the method 300 can be applied to a memory device having multiple victim cells and aggressor memory cells in one or more arrays. The aggressor memory cells can be defined as aggressors relative to specified memory cells that can be defined as victims based on the effect that the programming level of the aggressor cells has on a threshold voltage adjacent victim memory cells. Furthermore, a set of victim cells connected to one wordline can have a different level of sensitivity to aggressor cell programming levels than a set of victim cells connected to a different wordline. In some embodiments, each memory cell can be connected to a specified wordline and each memory cell can have one or more corresponding adjacent memory cells. These adjacent memory cells can each be respectively connected to a wordline that is adjacent to the specified wordline on the memory device. Therefore, to efficiently mitigate errors caused by the effects of C2C coupling and LM between adjacent cells, at block 302, the processing logic can determine a measure of aggressor memory cell state dependence for each memory cell (i.e., per wordline or per group of wordlines). For example, the processing logic can, at block 302, determine for each memory cell connected to each wordline, a respective value of a metric that reflects a sensitivity of a threshold voltage associated with the memory cell to a change in a threshold voltage of an adjacent cell. Further, the processing logic can, at block 304, aggregate the sensitivities of the cells connected to a particular wordline and determine each wordline's aggressor cell state dependence (e.g., in terms of an aggregate metric based on the spreads of sub-distributions of the cells connected to that wordline). For example, at block 304, the processing logic can determine, for each wordline, based on the determined sensitivity for each memory cell, a respective aggregate measure of adjacent cell dependence.

In some embodiment, at block 306, the processing logic can determine whether a given wordline's adjacent cell dependence is relatively low or high (e.g., with respect to a reference value or the dependence of other wordlines). For example, the processing logic can compare, for each wordline, the determined aggregate measure of adjacent cell dependence to a threshold dependence value, at block 306. Based on whether a particular wordline's determined aggregate measure of adjacent cell dependence is higher or lower than the threshold dependence value, the wordline can be categorized as a weak wordline or strong wordline and grouped into corresponding wordline groups. For example, at block 308 the processing logic can identify a first wordline group made up of wordlines having a measure of adjacent cell dependence that is higher than the threshold dependence value. Similarly, at block 310, in some embodiments, the processing logic can identify a second wordline group made up of wordlines having a measure of adjacent cell dependence that is lower than the threshold dependence value. In some embodiments, the wordlines can be grouped into more than two wordline groups based on a comparison of their aggressor cell dependence metric to the threshold dependence value. Further, to facilitate subsequent compensatory operations, the processing logic can, at block 312, store, on the memory device, a record listing the wordlines along with their corresponding wordline group. For example, the record can indicate the wordlines included in the second wordline group. In some embodiment, the record can indicate, for each wordline in its corresponding wordline group, a location on the die of the memory device. The performance of subsequent compensatory operations is described in more detail below with reference to FIG. 4.

Figure 4:
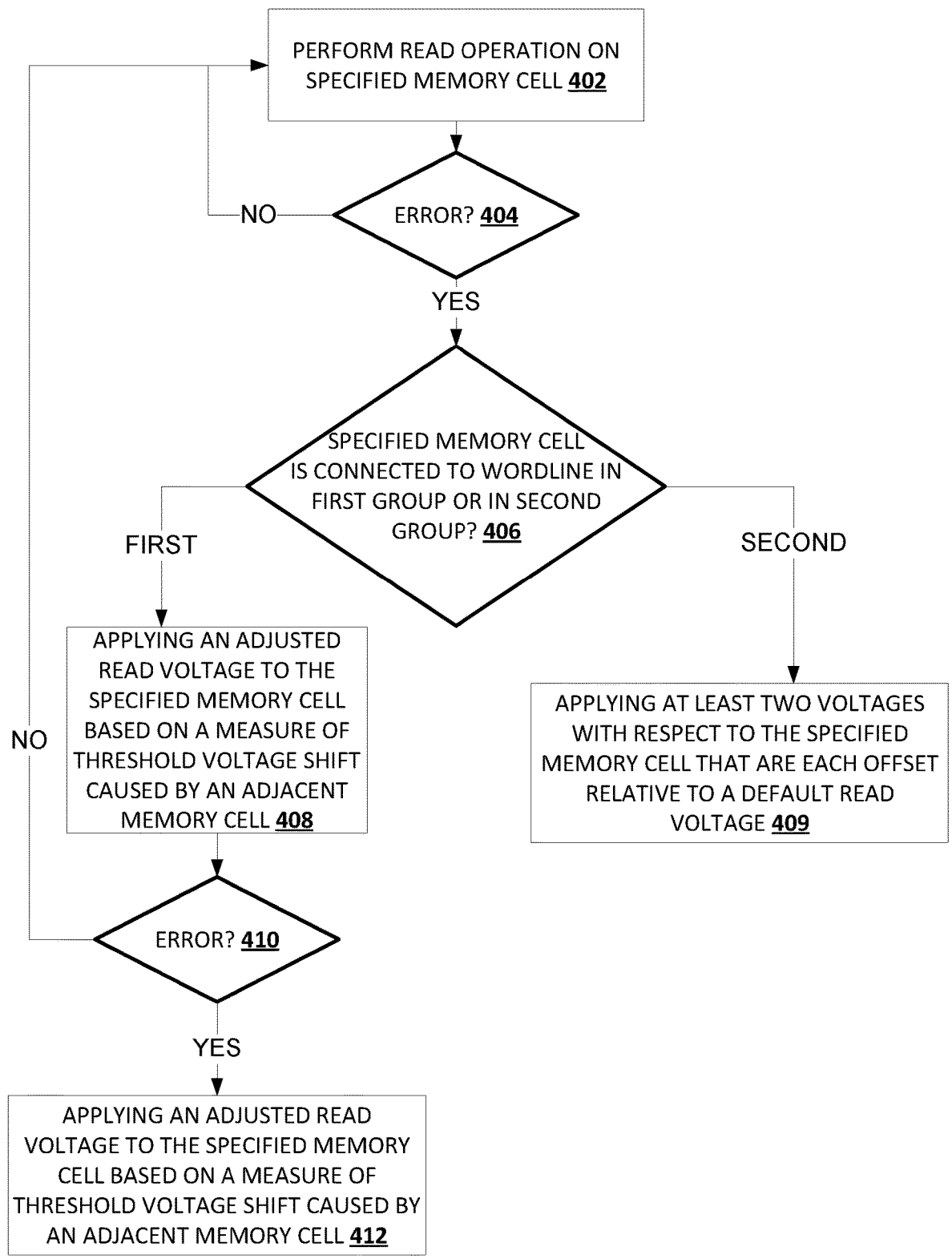
FIG. 4 is a flow diagram of an example method for error compensation based on wordline grouping in accordance with some embodiments of the present disclosure.

FIG. 4 is a flow diagram of an example method 400 for error compensation based on wordline grouping in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Accordingly, in some embodiments, at block 402, the processing logic can initially perform a memory access operation (e.g., a read operation) on a specified memory cell of a memory device. Then, the processing logic can, at block 404, determine whether an error is encountered during the operation. Upon encountering an error during the read operation with respect to a specified memory cell, the processing logic can determine, at block 406, based on a record (e.g., the record stored at block 312) whether the specified memory cell is connected to one of the wordlines in the first wordline group or to one of the wordlines in the second wordline group.

If at block 406 the processing logic determines that the specified memory cell is connected to a wordline in the first wordline group, then at block 408, the processing logic can perform a corrective read operation on the specified cell. For example, the processing logic can apply, at block 408, an adjusted read voltage to the specified memory cell based on a measure of threshold voltage shift caused by an adjacent memory cell. In some embodiments, if at block 406 the processing logic determines that the specified memory cell is connected to a wordline in the second wordline group, then at block 409 the processing logic can perform a soft bit read operation on the specified cell (i.e., a soft bit read operation that does not include a corrective read operation within it since the corrective read might not be very effective because the cells connected to wordlines in the second group are less sensitive to the effects of C2C coupling and LM). For example, the processing logic can, at block 409, apply at least two adjusted voltages with respect to the specified memory cell that are each offset relative to a default read voltage. As noted earlier, in some embodiments, the soft bit read operation can, at block 409, be performed without including a corrective read operation within it or any application of its adjusted voltages (i.e., voltages adjusted to compensate for the C2C coupling and/or LM effects). While the voltages applied during a soft read operation in this case can also be offset from an initial (i.e., default) voltage, the offsets can be unrelated to compensating for the C2C coupling and/or LM effects on the specified cell. In these embodiments, performing a soft bit read operation without a corrective read operation on a specified cell that is determined, at block 406, to be connected to a wordline in the second wordline group can result in much lower latency than if the soft bit read operation included the corrective read and associated adjusted voltage offsets.

After applying an adjusted read reference voltage at block 408, the processing logic can determine, at block 410, whether or not the error persists (i.e., continues to be encountered during a memory access operation) with respect to the specified cell. If no error is encountered at block 410, the processing logic can return to block 402 and continue to perform memory access operations on the memory cells. In some embodiments, in response to encountering an error at block 410 after applying the adjusted read voltage at block 408, the processing logic can perform, at block 412, a compensatory operation including a corrective read operation as part of a soft bit read operation. For example, at block 412, the processing logic can apply a subsequent adjusted read voltage (e.g., a read reference voltage with a different offset than that applied at block 408) and then apply at least two additional adjusted voltages with respect to the specified memory cell that are each offset relative to the subsequent adjusted read voltage (e.g., to determine the reliability of the adjusted read). In this example, the application subsequent adjusted read voltage and the two additional adjusted voltages can collectively comprise the soft bit read operation. In other words, at block 412, the processing logic can include the corrective read operation in the soft bit read operation whereas a typical soft bit read operation does not include the corrective read operation.

FIG. 5 is a flow diagram of an example method 500 of an example method for error compensation in memory devices in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 502, the processing logic can calculate, for a wordline on a die of a memory device, an aggregate measure of sensitivity of the memory cells connected to the wordline. The aggregate measure can reflect the collective sensitivity of each of those cells to a change in a threshold voltage of an adjacent cell. In some embodiments, the calculated measure of sensitivity can include a measure of a spread of respective memory cell threshold voltage distribution shifts. For example, each of these shifts can be associated with a corresponding programming state of an adjacent memory cell (i.e., the shifts can result in the aforementioned sub-distributions attributable to each respective adjacent aggressor cell programming level). Further, the processing logic can, at block 504, determine whether the calculated measure of sensitivity satisfies a criterion relative to a threshold value (i.e., sensitivity/dependence value). In some embodiments, to determine, at block 504, whether the calculated measure satisfies the criterion, the processing logic can determine, for a particular wordline, whether the measure of the spread of mean threshold voltages (i.e., a spread defined in terms of a difference between the mean values of two threshold voltage distributions) is greater than a threshold value.

Having at block 504, whether the calculated measure satisfies the criterion, the processing logic can, at block 506, determine whether an error is encountered when performing a memory access operation with respect to a specified memory cell. In some embodiments, the memory access operation can include a read operation with respect to the specified memory cell. Thus, in these embodiments, the memory access operation with respect to the memory cell can include applying a default read voltage (i.e., a default read reference voltage) to the specified memory cell.

Upon encountering the error during the memory access operation, the processing logic can, at block 508 adjust one or more voltages applied to the specified memory cell. In several embodiments, in response to encountering an error during a memory access operation with respect to a memory cell on the wordline, the processing logic can, at block 508, adjust one or more voltages applied to the memory cell based on the determination of whether the calculated measure of sensitivity satisfies the criterion. For example, if the measure of sensitivity satisfies the criterion, a voltage applied during a corrective read operation can be offset by a predetermined amount. If the measure of sensitivity does not satisfy the criterion, a voltage applied during a soft bit read operation can be offset accordingly.

In some embodiments, if, at block 504, it is determined that the calculated measure of sensitivity satisfies the criterion, the processing logic adjusting one or more voltages at block 508 can include adjusting a read voltage based on the measure of threshold voltage shift of the memory cell caused by a programming level of an adjacent memory cell. If, at block 508, after the processing logic adjusts the read voltage at least once, then in response to a recurrence of the error, the processing logic can perform a corrective read operation that as part of a soft bit read operation. For example, at block 508, the processing logic can adjust a subsequent read voltage and apply at least two additional adjusted voltages with respect to the memory cell that are each offset relative to the subsequent read voltage to thereby perform a soft bit read operation that includes a corrective read operation. However if, at block 504, it is determined that the calculated measure of sensitivity does not satisfy the criterion, the processing logic adjusting one or more voltages at block 508 can include performing a soft bit read. For example, it can include the processing logic applying, at block 508, at least two voltages with respect to the memory cell that are each offset relative to a default read voltage.

Figure 6:
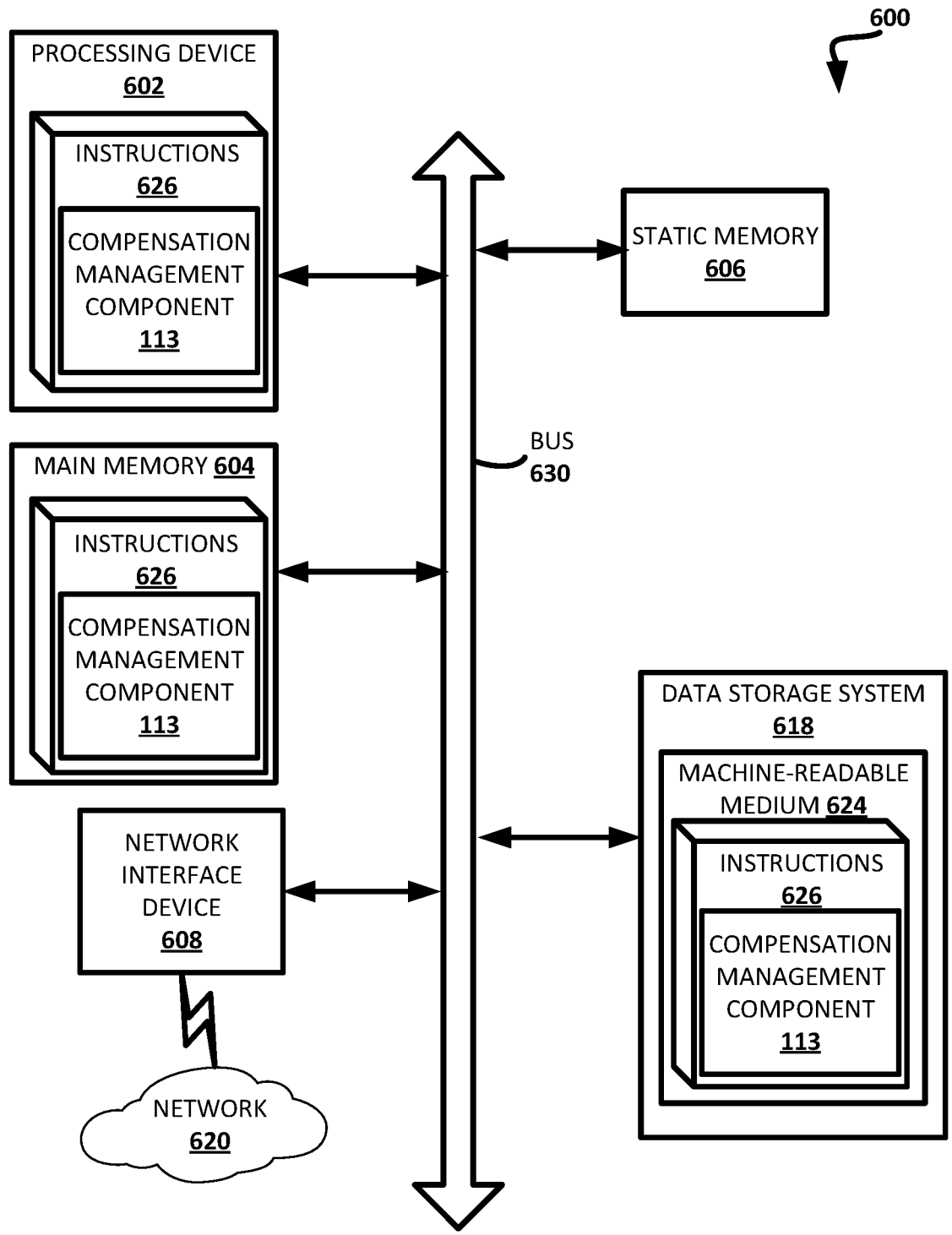
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the CMC 113 of FIG. 1, to method 300 of FIG. 3, to method, 400 of FIG. 4, or to method 500 of FIG. 5.) In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a compensation management component (e.g., the CMC 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of memory cells each respectively connected to a corresponding wordline of a plurality of wordlines located on a die of the memory device; and
a processing device, operatively coupled with the memory device, to perform operations comprising:
determining, for each memory cell connected to each wordline, a respective value of a metric that reflects a sensitivity of a threshold voltage associated with the memory cell to a change in a threshold voltage of an adjacent cell;
determining, for each wordline, based on the determined sensitivity for each memory cell, a respective aggregate measure of adjacent cell dependence;
comparing, for each wordline, the determined aggregate measure of adjacent cell dependence to a threshold dependence value;
identifying a first wordline group comprising wordlines having a measure of adjacent cell dependence that is higher than the threshold value;
identifying a second wordline group comprising wordlines having a measure of adjacent cell dependence that is lower than the threshold value; and
storing, on the memory device, a record referencing the wordlines of the second wordline group, the record indicating, for each wordline in the second wordline group, a corresponding location on the die of the memory device.

2. The system of claim 1, wherein the processing device is further to perform the operations comprising:
responsive to encountering an error during a read operation with respect to a specified memory cell of the plurality of memory cells, determining, based on the record, whether the specified memory cell is connected to one of the wordlines in the first wordline group or to one of the wordlines in the second wordline group.

3. The system of claim 2, wherein the processing device is further to perform the operations comprising:
responsive to determining that the specified memory cell is connected to one of the wordlines in the first wordline group, applying an adjusted read voltage to the specified memory cell based on a measure of threshold voltage shift caused by an adjacent memory cell.

4. The system of claim 3, wherein the processing device is further to perform the operations comprising:
responsive to encountering an error after applying the adjusted read voltage, applying a subsequent adjusted read voltage and applying at least two additional adjusted voltages with respect to the specified memory cell that are each offset relative to the subsequent adjusted read voltage.

5. The system of claim 3, wherein the adjusted read voltage depends on a number of bits of adjacent cell programming state information and on a number of wordlines that are adjacent to the wordline connected to the specified memory cell.

6. The system of claim 2, wherein the processing device is further to perform the operations comprising:
responsive to determining that the specified memory cell is connected to one of the wordlines in the second wordline group, applying at least two adjusted voltages with respect to the specified memory cell that are each offset relative to a default read voltage.

7. The system of claim 1, wherein each memory cell is connected to a specified wordline and each memory cell has one or more corresponding adjacent memory cells that are respectively connected to a wordline that is adjacent to the specified wordline on the memory device.

8. A method comprising:
determining, for a each memory cell connected to each wordline of a plurality of wordlines on a die of a memory device, a respective value of a metric that reflects a sensitivity of a threshold voltage associated with the memory cell to a change in a threshold voltage of an adjacent cell;
determining, for each wordline, based on the determined sensitivity for each memory cell, a respective aggregate measure of adjacent cell;
comparing, for each wordline, the determined aggregate measure of adjacent cell dependence to a threshold dependence value;
identifying a first wordline group comprising wordlines having a measure of adjacent cell dependence that is higher than the threshold value and a second wordline group comprising wordlines having a measure of adjacent cell dependence that is lower than the threshold value; and
storing, on the memory device, a record referencing the wordlines of the second wordline group, the record indicating, for each wordline in the second wordline group, a corresponding location on the die of the memory device.

9. The method of claim 8, further comprising:
responsive to encountering an error during a read operation with respect to a specified memory cell, determining, based on the record, whether the specified memory cell is connected to one of the wordlines in the first wordline group or to one of the wordlines in the second wordline group.

10. The method of claim 9, further comprising:
responsive to determining that the specified memory cell is connected to one of the wordlines in the first wordline group, applying an adjusted read voltage to the specified memory cell based on a measure of threshold voltage shift caused by an adjacent memory cell.

11. The method of claim 10, further comprising:
responsive to encountering an error after applying the adjusted read voltage, applying a subsequent adjusted read voltage and applying at least two additional adjusted voltages with respect to the specified memory cell that are each offset relative to the subsequent adjusted read voltage.

12. The method of claim 10, wherein adjusted read voltage depends on a number of bits of adjacent cell programming state information and on a number of wordlines that are adjacent to the wordline connected to the specified memory cell.

13. The method of claim 9, further comprising:
responsive to determining that the specified memory cell is connected to one of the wordlines in the second wordline group, applying at least two adjusted voltages with respect to the specified memory cell that are each offset relative to a default read voltage.

14. The method of claim 8, wherein each memory cell is connected to a specified wordline and each memory cell has one or more corresponding adjacent memory cells that are respectively connected to a wordline that is adjacent to the specified wordline on the memory device.

15. A non-transitory computer-readable storage medium comprising instructions that, when executed by a processing device, cause the processing device to perform operations comprising:

calculating, for a wordline on a die of a memory device, an aggregate measure of sensitivity of memory cells connected to the wordline to a change in a threshold voltage of an adjacent cell, wherein the calculated measure of sensitivity comprises a measure of a spread of respective memory cell threshold voltage distribution shifts, wherein each shift is associated with a corresponding programming state of an adjacent memory cell;

determining whether the calculated measure of sensitivity satisfies a criterion relative to a threshold sensitivity value; and responsive to encountering an error during a memory access operation with respect to a memory cell on the wordline, adjusting one or more voltages applied to the memory cell based on the determination of whether the calculated measure of sensitivity satisfies the criterion.

16. The non-transitory computer-readable storage medium of claim 15, wherein responsive to determining that the calculated measure of sensitivity satisfies the criterion, adjusting the one or more voltages comprises:

adjusting a read voltage based on a measure of threshold voltage shift of the memory cell caused by a programming level of an adjacent memory cell.

17. The non-transitory computer-readable storage medium of claim 16, wherein responsive to determining that the calculated measure of sensitivity satisfies the criterion, adjusting the one or more voltages further comprises:

subsequent to adjusting the read voltage, responsive to a recurrence of the error, adjusting a subsequent read voltage and applying at least two additional adjusted voltages with respect to the memory cell that are each offset relative to the subsequent read voltage.

18. The non-transitory computer-readable storage medium of claim 15, wherein responsive to determining that the calculated measure of sensitivity does not satisfy the criterion, adjusting the one or more voltages comprises:

applying at least two adjusted voltages with respect to the memory cell that are each offset relative to a default read voltage.

19. The non-transitory computer-readable storage medium of claim 15, wherein determining whether the calculated measure of sensitivity satisfies the criterion comprises:

determining, for the wordline, whether the measure of a spread of mean threshold voltages is greater than a threshold spread value.

20. The non-transitory computer-readable storage medium of claim 19, wherein the memory access operation with respect to the memory cell comprises applying a default read voltage to the memory cell.

* * * * *